(12) United States Patent
Saito et al.

(10) Patent No.: US 7,723,783 B2
(45) Date of Patent: May 25, 2010

(54) SEMICONDUCTOR DEVICE

(75) Inventors: Wataru Saito, Kanagawa-ken (JP);
Ichiro Omura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 701 days.

(21) Appl. No.: 11/562,708

(22) Filed: Nov. 22, 2006

(65) Prior Publication Data
US 2007/0114602 A1    May 24, 2007

(30) Foreign Application Priority Data
Nov. 24, 2005   (JP) .............................. 2005-338377

(51) Int. Cl.
*H01L 29/94* (2006.01)
(52) U.S. Cl. ............... 257/330; 257/331; 257/E29.262; 438/270
(58) Field of Classification Search ......... 257/330–334, 257/409, E29.262, E29.257; 438/270–272
See application file for complete search history.

(56) References Cited
U.S. PATENT DOCUMENTS

| 5,216,275 | A | 6/1993 | Chen | |
|---|---|---|---|---|
| 6,849,880 | B1 | 2/2005 | Saito et al. | |
| 6,888,195 | B2 * | 5/2005 | Saito et al. | 257/328 |
| 2002/0185705 | A1 * | 12/2002 | Saitoh et al. | 257/492 |
| 2006/0216896 | A1 | 9/2006 | Saito et al. | |
| 2006/0220156 | A1 | 10/2006 | Saito et al. | |

OTHER PUBLICATIONS

U.S. Appl. No. 11/933,869, filed Nov. 1, 2007, Saito, et al.

\* cited by examiner

*Primary Examiner*—Kiesha R Bryant
*Assistant Examiner*—Tucker Wright
(74) *Attorney, Agent, or Firm*—Oblon, Spivak, McClelland, Maier & Neustadt, L.L.P.

(57) ABSTRACT

A semiconductor device includes: a first semiconductor layer of a first conductivity type; a first semiconductor region of the first conductivity type and a second semiconductor region of a second conductivity type alternately arranged in a lateral direction on the first semiconductor layer of the first conductivity type; a third semiconductor region of the second conductivity type formed on the first semiconductor region; a fourth semiconductor region of the first conductivity type formed on a portion of the surface of the third semiconductor region; a control electrode provided via an first insulating film in a groove formed in contact with the fourth semiconductor region, the third semiconductor region, and the first semiconductor region; a first main electrode electrically connected to the first semiconductor layer; a second main electrode forming a junction with the third and fourth semiconductor region; and a fifth semiconductor region of the second conductivity type. The fifth semiconductor region is formed in contact with the first insulating film, the first semiconductor region, and the second semiconductor region. The bottom face of the fifth semiconductor region is deeper than the bottom face of the control electrode. Alternatively, the fifth semiconductor region may be spaced apart from the first insulating film.

11 Claims, 19 Drawing Sheets

SEMICONDUCTOR DEVICE

CROSS-REFERENCE TO RELATED APPLICATIONS

This application is based upon and claims the benefit of priority from the prior Japanese Patent Application No. 2005-338377, filed on Nov. 24, 2005; the entire contents of which are incorporated herein by reference.

BACKGROUND OF THE INVENTION

1. Field of the Invention

This invention relates to a semiconductor device, and more particularly to a semiconductor device of the trench gate structure based on the superjunction structure.

2. Background Art

Circuits such as switching power supplies and inverters are based on power semiconductor devices including switching devices and diodes. Typically used are vertical power MOSFETs (Metal Oxide Semiconductor Field Effect Transistors) having a source, a gate, and a drain arranged vertically. Power semiconductor devices are required to have such characteristics as high breakdown voltage and low on-resistance ($R_{ON}$). The on-resistance ($R_{ON}$) of a vertical power MOSFET greatly depends on the electric resistance of the conduction layer (hereinafter referred to as drift layer) portion. The doping concentration determining the electric resistance of the drift layer cannot be increased above the limit corresponding to the breakdown voltage of the pn-junction formed by the base region and the drift layer. Thus there is a tradeoff between the device breakdown voltage and the on-resistance ($R_{ON}$) which depend on the device material. Improving this tradeoff has been a serious problem for vertical power MOSFETs.

Vertical MOSFETs to solve this problem include those of the superjunction structure. Instead of the n-type layer in the conventional structure, the superjunction structure has p-pillar regions and n-pillar regions alternately buried in the drift layer portion. By equalizing the amount of impurities contained in the p-pillar region and the n-pillar region, the drift layer is artificially made a non-doped layer. During the off-time, a horizontally spreading depletion layer maintains high breakdown voltage. During the on-time, a current is allowed to flow through the n-pillar region doped with high concentration. Thus, the superjunction structure has realized a device with a high breakdown voltage and a low on-resistance ($R_{ON}$) over the limit of the material.

Actually, the lateral period of the superjunction structure needs to be decreased for improving the tradeoff between the breakdown voltage and the on-resistance ($R_{ON}$) using the superjunction. Furthermore, the lateral period of the MOS gate structure, or the so-called cell pitch, also needs to be decreased simultaneously for reducing the overall on-resistance ($R_{ON}$) of the device.

In response to these requirements, a vertical MOSFET has been proposed (U.S. Pat. No. 5,216,275), where the MOS gate structure is based on the trench gate structure. For example, a vertical MOSFET of the trench gate structure shown in FIG. 4 of the '275 patent has a superjunction structure where n-pillar regions 6 and p-pillar regions 7 are alternately buried in a drift layer 5. A control gate electrode G is formed via a gate insulating film 1 in the trench provided in the p-base region 3. During the on-time, a channel is formed in the p-base region 3 being in contact with the gate insulating film 1, and a current flows from the source region 2 to the drain region 4.

In the trench gate structure described above, the trench bottom needs to be formed as deep as or deeper than the p-base region 3 for ensuring the channel. When the trench gate bottom is formed deeper than the p-base region 3, the electric field is maximized at the trench gate bottom during application of high voltage. Hence avalanche breakdown due to high voltage occurs at the trench bottom. Holes generated by the avalanche breakdown flow into the p-base region 3 via the MOS channel. Because of high release resistance of the channel against holes, holes are not rapidly released, and the avalanche withstand capability is decreased. Furthermore, carriers generated by the avalanche breakdown impinge into the gate insulating film 1, thereby decreasing the reliability of the gate insulating film.

Thus, there is a problem that vertical MOSFETs of the trench gate structure have lower avalanche withstand capability and hence lower reliability of the gate insulating film than lateral MOSFETs.

SUMMARY OF THE INVENTION

According to an aspect of the invention, there is provided a semiconductor device including: a first semiconductor layer of a first conductivity type; a first semiconductor region of the first conductivity type and a second semiconductor region of a second conductivity type alternately arranged in a lateral direction on the first semiconductor layer of the first conductivity type; a third semiconductor region of the second conductivity type formed on the first semiconductor region; a fourth semiconductor region of the first conductivity type formed on a portion of the surface of the third semiconductor region; a control electrode provided via an first insulating film in a groove formed in contact with the fourth semiconductor region, the third semiconductor region, and the first semiconductor region; a first main electrode electrically connected to the first semiconductor layer; a second main electrode forming a junction with the third and fourth semiconductor region; and a fifth semiconductor region of the second conductivity type formed in contact with the first insulating film, the first semiconductor region, and the second semiconductor region, the bottom face of the fifth semiconductor region being deeper than the bottom face of the control electrode.

According to other aspect of the invention, there is provided a semiconductor device including: a first semiconductor layer of a first conductivity type; a first semiconductor region of the first conductivity type and a second semiconductor region of a second conductivity type alternately arranged in a lateral direction on the first semiconductor layer;

a third semiconductor region of the second conductivity type formed on the first semiconductor region; a fourth semiconductor region of the first conductivity type formed on a portion of the surface of the third semiconductor region; a control electrode provided via an first insulating film in a groove formed in contact with the fourth semiconductor region, the third semiconductor region, and the first semiconductor region; a first main electrode electrically connected to the first semiconductor layer; a second main electrode forming a junction with the third and fourth semiconductor region; and a fifth semiconductor region of the second conductivity type spaced apart from the first insulating film and formed in contact with the first semiconductor region and the second semiconductor region, the bottom face of the fifth semiconductor region being deeper than the bottom face of the control electrode.

DETAILED DESCRIPTION OF THE INVENTION

Embodiments of the invention will now be described with reference to the drawings.

Figure 1:
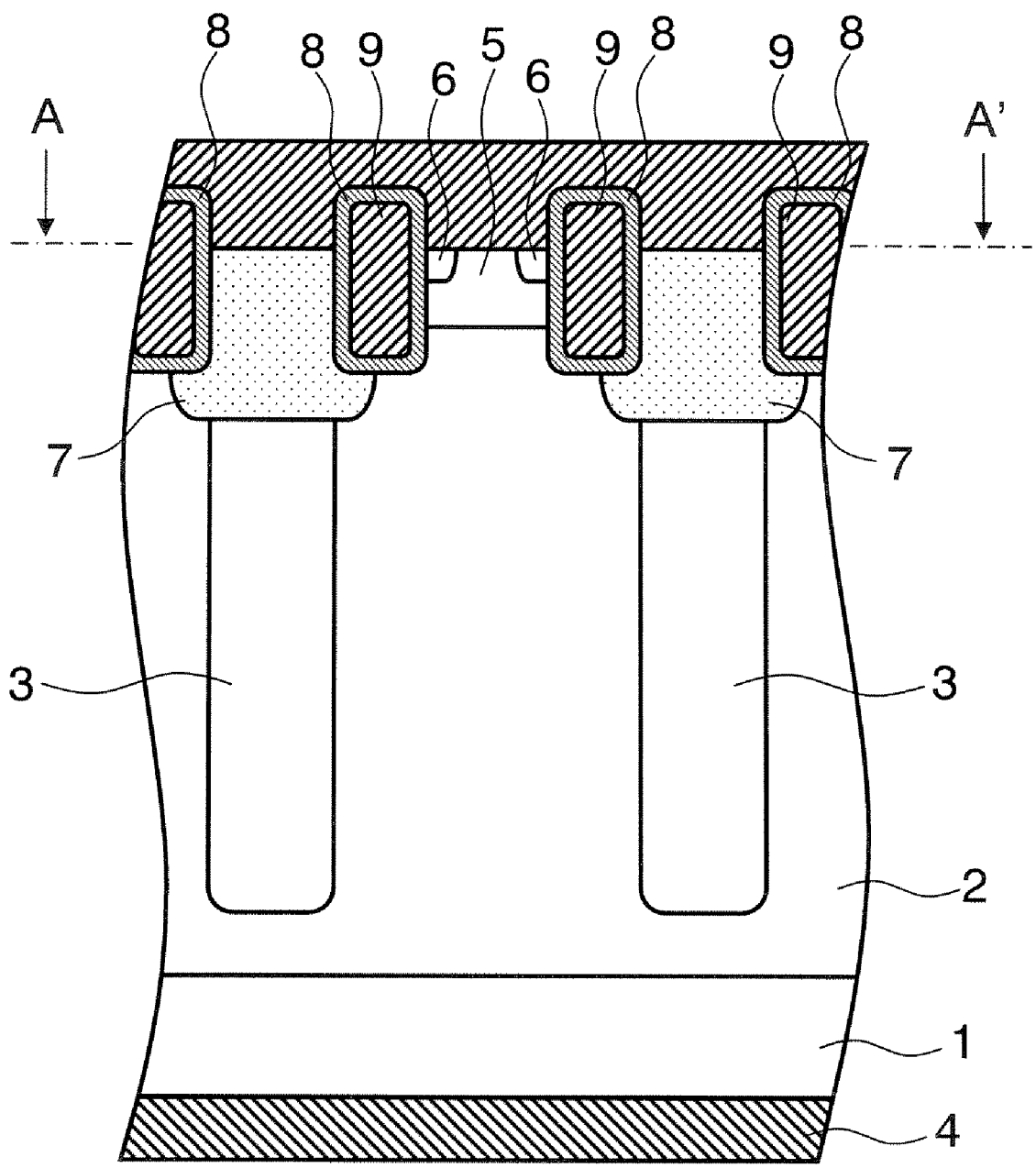
FIG. 1 is a schematic cross section showing the structure of a MOSFET according to a first embodiment of the invention.

FIG. 1 is a schematic cross section showing the structure of a MOSFET according to a first embodiment of the invention. While the following embodiments are described assuming the first conductivity type as n-type and the second conductivity type as p-type, the invention is not limited thereto.

In the MOSFET shown in FIG. 1, an n-pillar region 2 (first semiconductor region) and a p-pillar region 3 (second semiconductor region) are alternately formed on a major surface of an $n^+$-drain layer 1 (first semiconductor layer of the first conductivity type) and constitutes a superjunction structure. A drain electrode 4 (first main electrode) is formed on the backside of the $n^+$-drain layer 1.

A p-base region 5 (third semiconductor region) is formed on the surface of the n-pillar region 2, and an n-source region 6 (fourth semiconductor region) is formed on the surface of the p-base region 5. A p-guard ring region 7 (fifth semiconductor region) having a higher concentration than the p-pillar region is formed on the surface of the p-pillar region 3. A trench groove is formed so as to extend from the n-source region 6 via the p-base region 5 to the n-pillar region 2, and a gate electrode 9 (control electrode) is formed via a gate insulating film 8.

A source electrode 10 (second main electrode) is formed on the p-base region 5, the n-source region 6, and the p-guard ring region 7, and electrically connected thereto.

As seen in FIG. 1, the bottom of the p-guard ring region 7 is formed deeper than the bottom of the trench groove. This p-guard ring region 7 serves to solve the problems of decreased avalanche withstand capability and degradation of the gate insulating film. In the following, the function of the p-guard ring region 7 is described using the reference figure (FIG. 2).

Figure 2A:
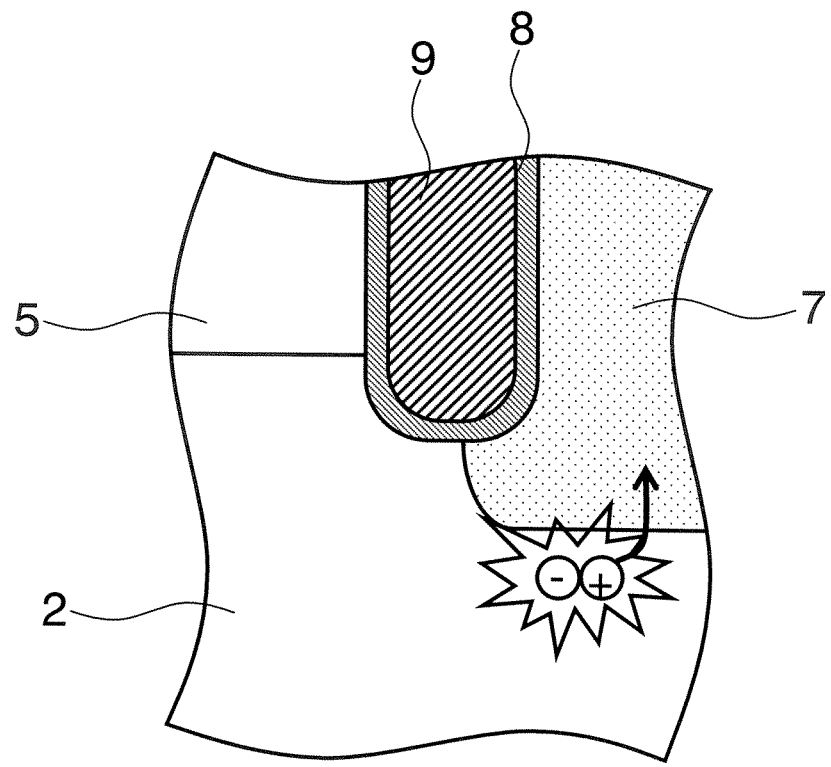
FIG. 2A is a schematic cross section enlarging a portion of the MOSFET shown in FIG. 1.
Figure 2B:
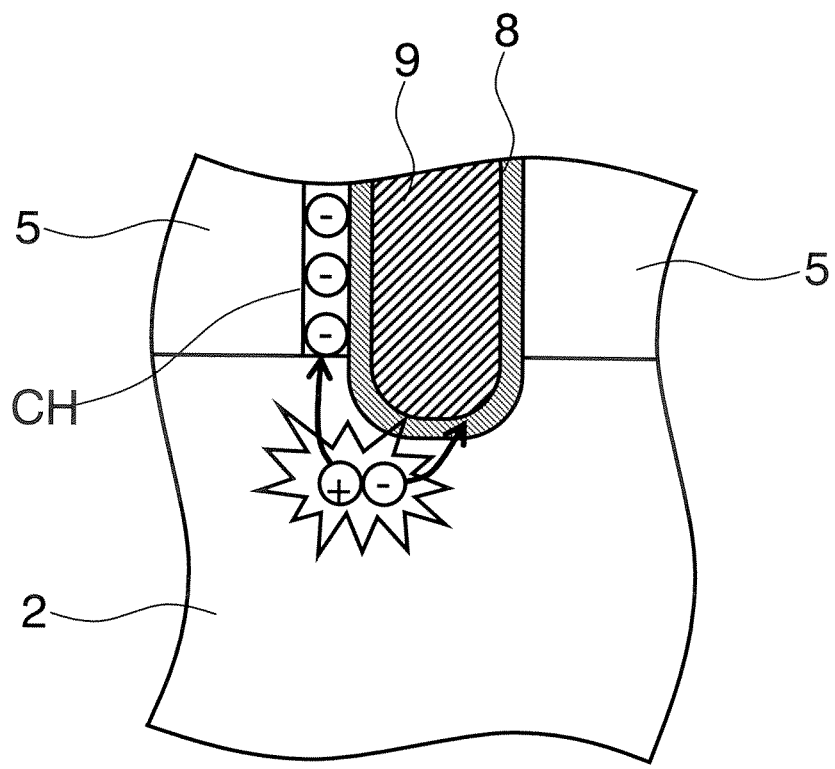
FIG. 2B is a schematic cross section enlarging the same portion of the MOSFET having no p-guard ring region.

FIG. 2A is a schematic cross section enlarging a portion of the MOSFET shown in FIG. 1, and FIG. 2B is a schematic cross section enlarging the same portion of the MOSFET having no p-guard ring region.

In the MOSFET having no p-guard ring region shown in FIG. 2B, the electric field is maximized at the trench gate bottom during application of high voltage. At this time, avalanche breakdown occurs at the trench bottom. Holes generated by the avalanche breakdown flow into the p-base region via the MOS channel CH. However, because of high release resistance of the MOS channel CH, release of holes is delayed, thereby destroying the device. Thus the avalanche withstand capability becomes lower than for the planar gate structure in which a channel is formed horizontally with respect to the surface of the p-base region. Furthermore, carriers generated by the avalanche breakdown impinge into the gate insulating film, thereby decreasing the reliability of the gate insulating film.

In contrast, in the case of the MOSFET according to the first embodiment of the invention shown in FIG. 2A, the electric field is maximized at the bottom of the p-guard ring region 7 formed deeper than the trench gate bottom. Therefore avalanche breakdown occurs at the bottom of the p-guard ring region 7 rather than at the trench gate bottom. Holes generated at this time are rapidly released to the source electrode via the p-guard ring region 7. Because the hole current does not flow into the p-base region 5, the operation of the parasite bipolar transistor is prevented. Thus a high avalanche withstand capability can be achieved. Furthermore, because the p-guard ring region 7 is formed deeper than the gate electrode 9, the point at which avalanche breakdown occurs, shifts to a position away from the gate insulating film. Moreover, because the electric field applied to the gate insulating film 8 decreases, the generated holes do not impinge into the gate insulating film 8. Therefore high reliability of the gate insulating film can be achieved.

In conventional power MOSFETs having the trench gate structure, n-source regions are often formed on both sides of the trench sidewall to increase the channel density. However, in a MOSFET having high breakdown voltage, the proportion of the channel resistance to the overall on-resistance ($R_{ON}$) of the device is as low as about 1 percent. Thus, even if the channel is formed only on one side of the trench sidewall as in the MOSFET structure shown in FIG. 1, the increase of the on-resistance ($R_{ON}$) causes no problem.

Figure 3:
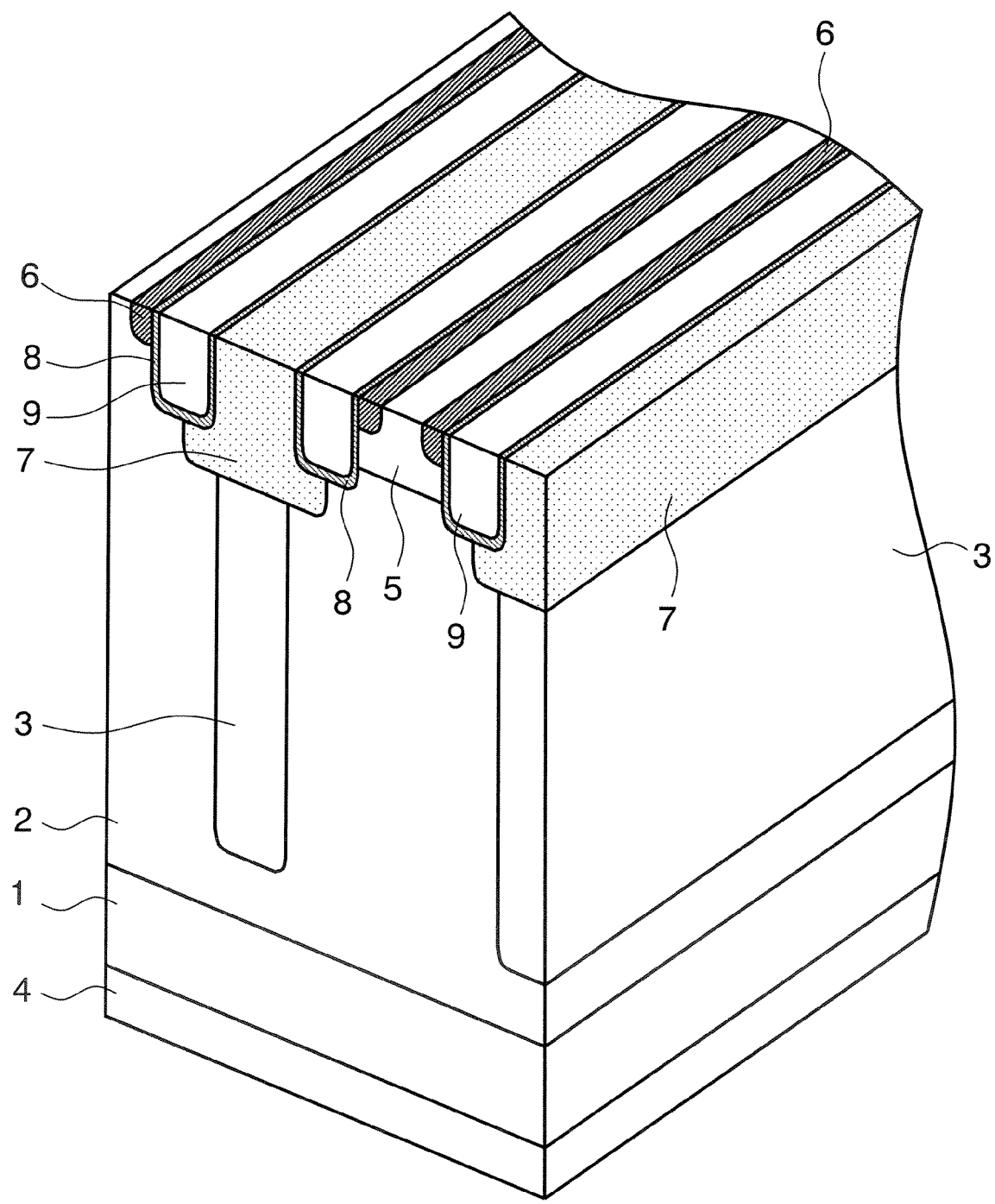
FIG. 3 is a perspective schematic view of the MOSFET shown in FIG. 1 as viewed from the A-A' cross section.

FIG. 3 is a perspective schematic view of the MOSFET shown in FIG. 1 as viewed from the A-A' cross section.

As shown in FIG. 3, the p-guard ring region 7, the gate electrode 9, and the n-source region 6 can be formed in parallel in a striped configuration. As the impurity concentration of the p-guard ring region 7 increases, the release resistance against holes can be decreased. As seen in FIG. 3, because the p-guard ring region 7 is formed in a region distinct from the channel formation region, the p-guard ring region 7 does not affect the gate threshold voltage (Vth). Thus the concentration of the p-guard ring region 7 can be set sufficiently high. The high concentration of the p-guard ring region 7 allows a sufficient junction depth to be obtained even for a short duration of heating process. Naturally, ion implantation with high acceleration voltage can be used to form a deep p-guard ring region.

Figure 4:
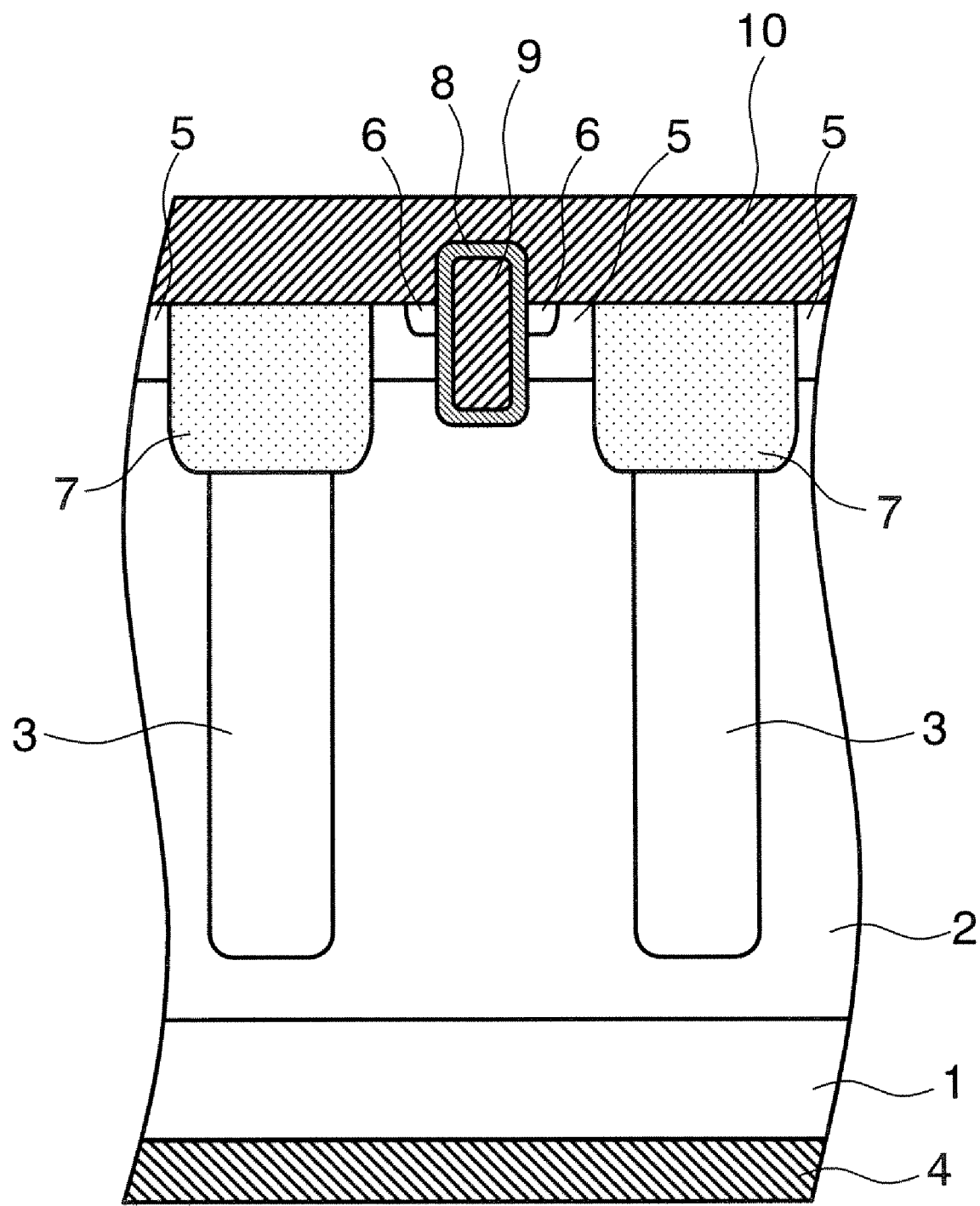
FIG. 4 is a schematic cross section showing the structure of a MOSFET according to a second embodiment of the invention.

FIG. 4 is a schematic cross section showing the structure of a MOSFET according to a second embodiment of the invention. Elements similar to those in the MOSFET shown in FIG. 1 are marked with the same reference numerals and not described in detail.

The MOSFET shown in this figure is different from the MOSFET shown in FIG. 1 in that the trench gate is formed so as to divide the p-base region 5. In the structure of this figure again, the point at which avalanche breakdown occurs is located at the bottom of the p-guard ring region 7, which is deeper than the gate electrode, because the bottom of the p-guard ring region 7 is formed deeper than the bottom of the trench groove. Thus, like the MOSFET shown in FIG. 1, the avalanche withstand capability and the reliability of the gate insulating film can be enhanced. Furthermore, with a smaller number of gate electrodes than in the MOSFET shown in FIG. 1, the same channel density can be ensured.

Figure 5:
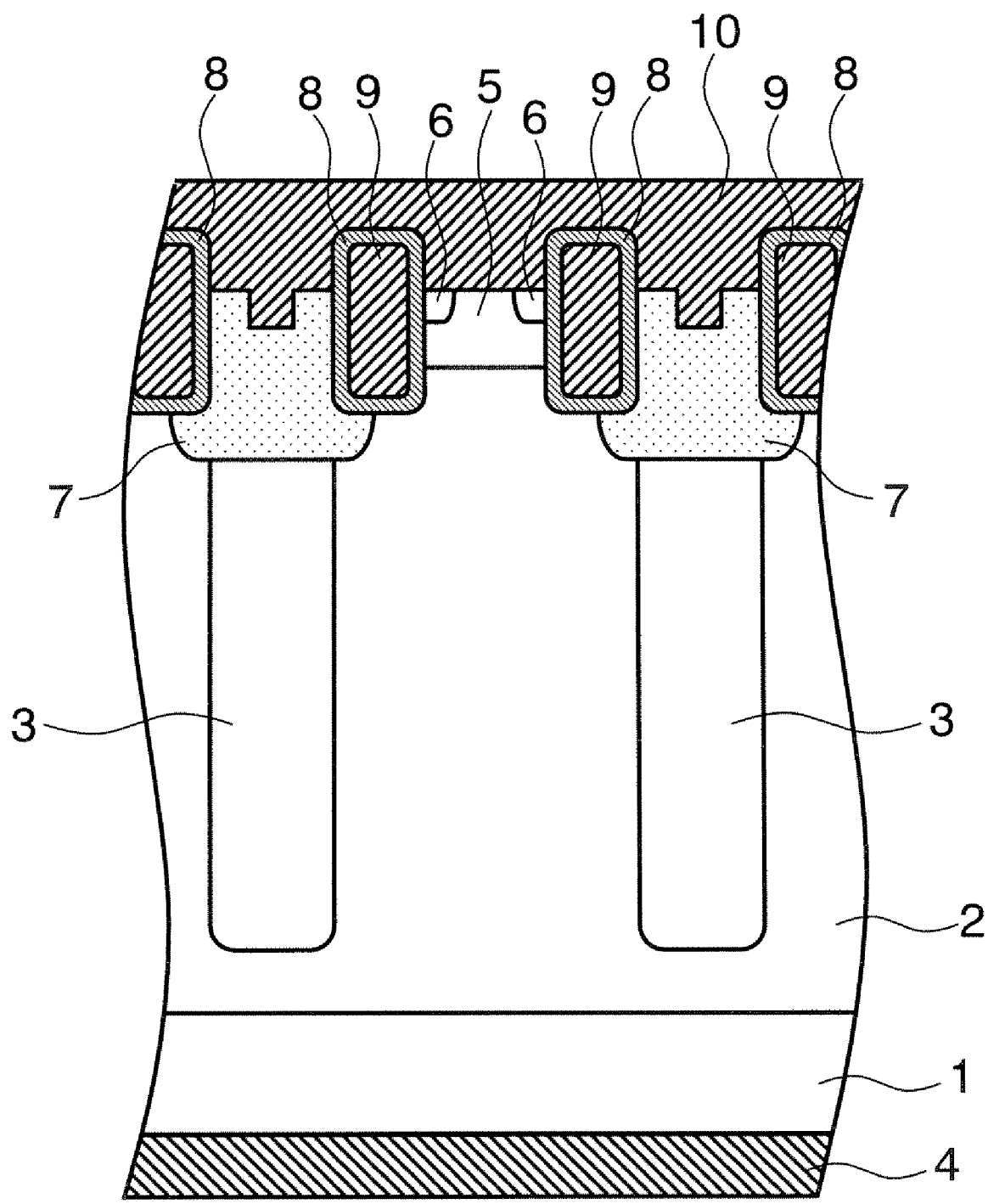
FIG. 5 is a schematic cross section showing the structure of a MOSFET according to a third embodiment of the invention.

FIG. 5 is a schematic cross section showing the structure of a MOSFET according to a third embodiment of the invention. Elements similar to those in the MOSFET shown in FIG. 1 are marked with the same reference numerals and not described in detail.

The MOSFET shown in this figure is different from the MOSFET shown in FIG. 1 in that a trench contact is used for the contact between the p-guard ring region 7 and the source electrode 10. In the structure of this figure again, the point at which avalanche breakdown occurs is located at the bottom of the p-guard ring region 7, which is deeper than the gate electrode, because the bottom of the p-guard ring region 7 is formed deeper than the bottom of the trench groove. Thus, like the MOSFET shown in FIG. 1, the avalanche withstand capability and the reliability of the gate insulating film can be enhanced. Furthermore, use of the trench contact allows a deeper junction depth to be achieved.

Figure 6:
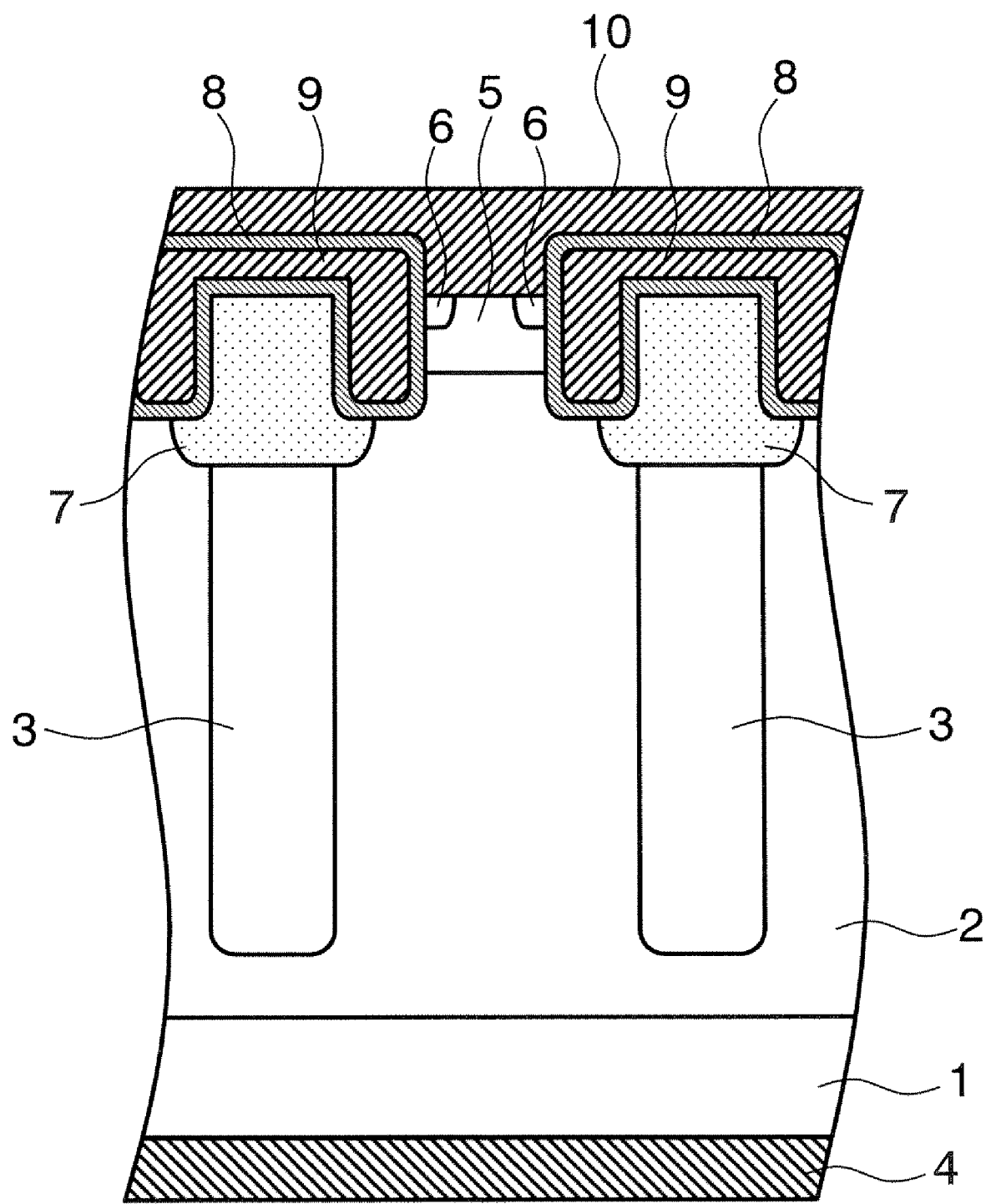
FIG. 6 is a schematic cross section showing the structure of a MOSFET according to a fourth embodiment of the invention.

FIG. 6 is a schematic cross section showing the structure of a MOSFET according to a fourth embodiment of the invention. Elements similar to those in the MOSFET shown in FIG. 1 are marked with the same reference numerals and not described in detail.

The MOSFET shown in this figure is different from the MOSFET shown in FIG. 1 in that adjacent gate electrodes 9 are linked to have an inverted U shape in the cross section. In the structure of this figure again, the point at which avalanche breakdown occurs is located at the bottom of the p-guard ring region 7, which is deeper than the gate electrode, because the bottom of the p-guard ring region 7 is formed deeper than the bottom of the trench groove. Thus, like the MOSFET shown in FIG. 1, the avalanche withstand capability and the reliability of the gate insulating film can be enhanced. Furthermore, because the cross-sectional area of the gate electrode 9 is increased, the extraction resistance of the gate electrode can be reduced.

It should be noted that, while the p-guard ring region 7 is not connected to the source electrode 10 in the cross section shown in FIG. 6, the p-guard ring region 7 is connected to the source electrode 10 in a region of the chip not shown in the figure.

Figure 7:
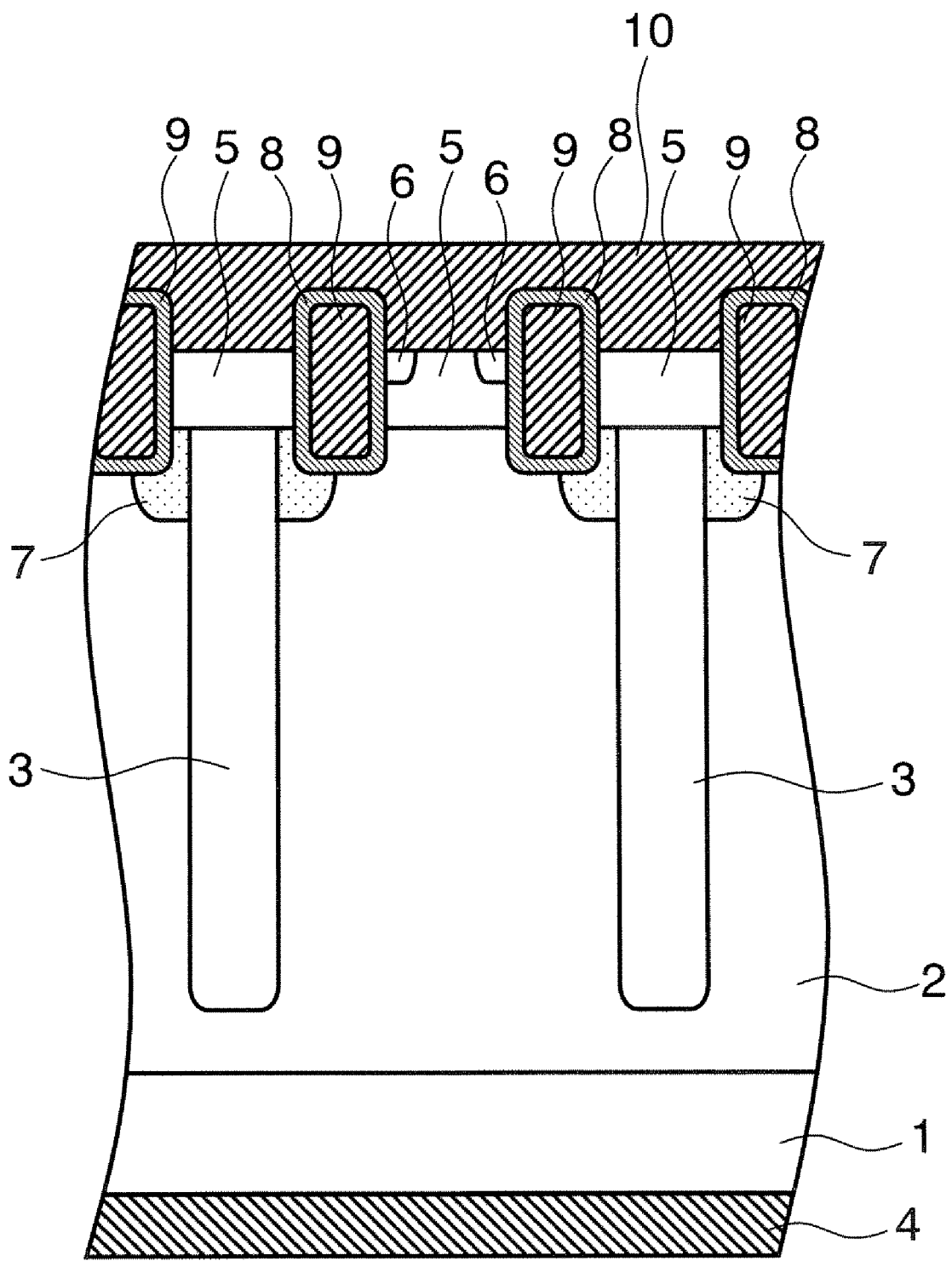
FIG. 7 is a schematic cross section showing the structure of a MOSFET according to a fifth embodiment of the invention.

FIG. 7 is a schematic cross section showing the structure of a MOSFET according to a fifth embodiment of the invention. Elements similar to those in the MOSFET shown in FIG. 1 are marked with the same reference numerals and not described in detail.

The MOSFET shown in this figure is different from the MOSFET shown in FIG. 1 in that the p-guard ring region 7 is divided by the p-pillar region 3 and the p-base region 5 is also formed thereon. Such a structure is attributed to the adopted process where the p-guard ring region 7 is formed before the p-pillar region 3.

FIG. 8 is a process cross section showing part of a process of manufacturing the MOSFET shown in FIG. 7. In FIG. 8, only the distinctive part of the process, that is, the step of forming the p-guard ring region 7 and the p-pillar region 3 is shown, and the rest of the process is omitted.

Figure 8A:
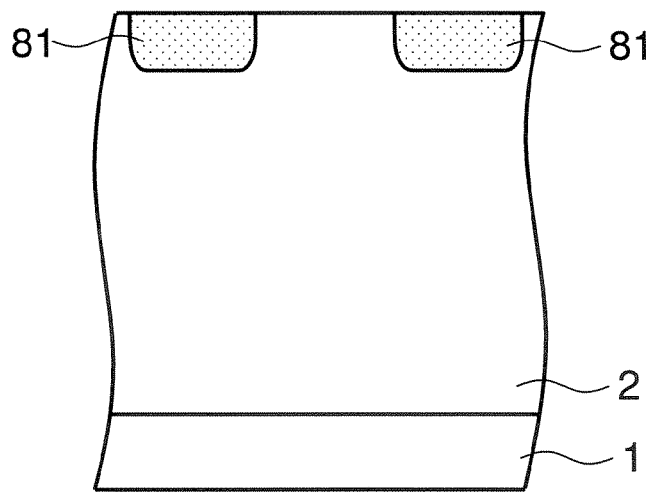
FIG. 8 is a process cross section showing part of a process of manufacturing the MOSFET shown in FIG. 7.

First, as shown in FIG. 8A, an n-type silicon layer serving as an n-pillar region 2 is epitaxially grown on a high-concentration n$^+$-silicon substrate serving as an n$^+$-drain layer 1. The ion implantation and diffusion process is used to form a p-type region 81 having a relatively high concentration in a prescribed region on the surface of the n-type silicon layer 2. This p-type region 81 is to be a p-guard ring region 7.

Figure 8B:
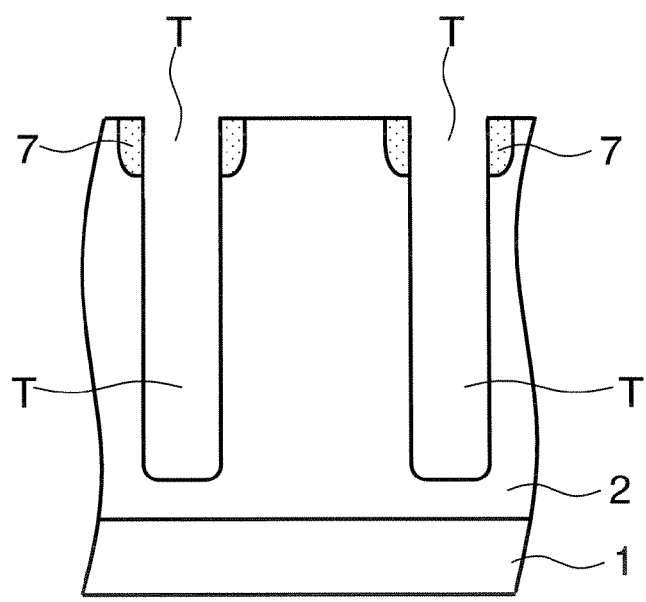

Next, as shown in FIG. 8B, at the center of this p-type region 81, an etching mask (not shown) is used to form a deep trench T. Thus the guard ring region 7 is formed on the upper side face of the trench T.

Figure 8C:
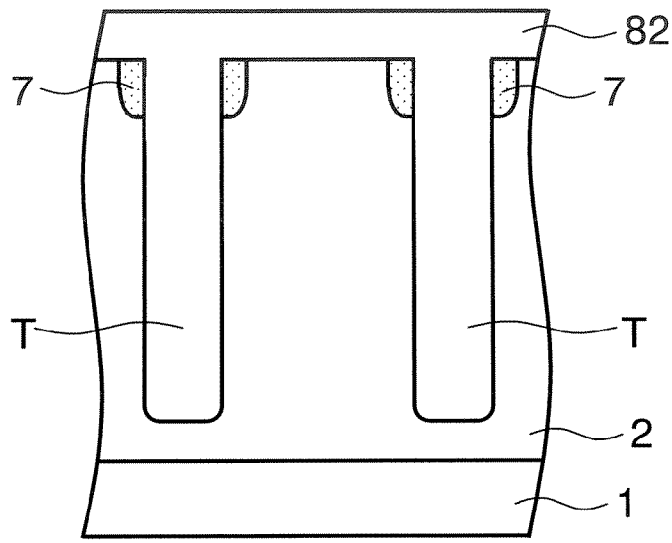

Next, as shown in FIG. 8C, epitaxial growth is used to form a p-type semiconductor layer 82 so as to fill the trench T. In a later step, the p-type semiconductor layer 82 is planarized to result in a p-pillar region 3 on which a p-base region is formed.

Thus, by conducting the heating step for forming a p-guard ring region having high concentration before forming the p-pillar region 3, the heating step after forming the p-pillar region 3 is shortened. Hence dopants in the p-pillar region 3 can be prevented from diffusing into the n-pillar region 2. By preventing seepage of impurities into the n-pillar region 2, the effective pillar impurity concentration can be maintained at a high level, and a low on-resistance ($R_{ON}$) can be achieved.

Again, in the structure of the MOSFET shown in FIG. 7, the point at which avalanche breakdown occurs is located at the bottom of the p-guard ring region 7, which is deeper than the gate electrode, because the bottom of the p-guard ring region 7 is formed deeper than the bottom of the trench groove. Thus, like the MOSFET shown in FIG. 1, the avalanche withstand capability and the reliability of the gate insulating film can be enhanced. Furthermore, the decrease of effective impurity concentration in the n-pillar region 2 can be prevented to enhance low on-resistance ($R_{ON}$) characteristics.

Figure 9:
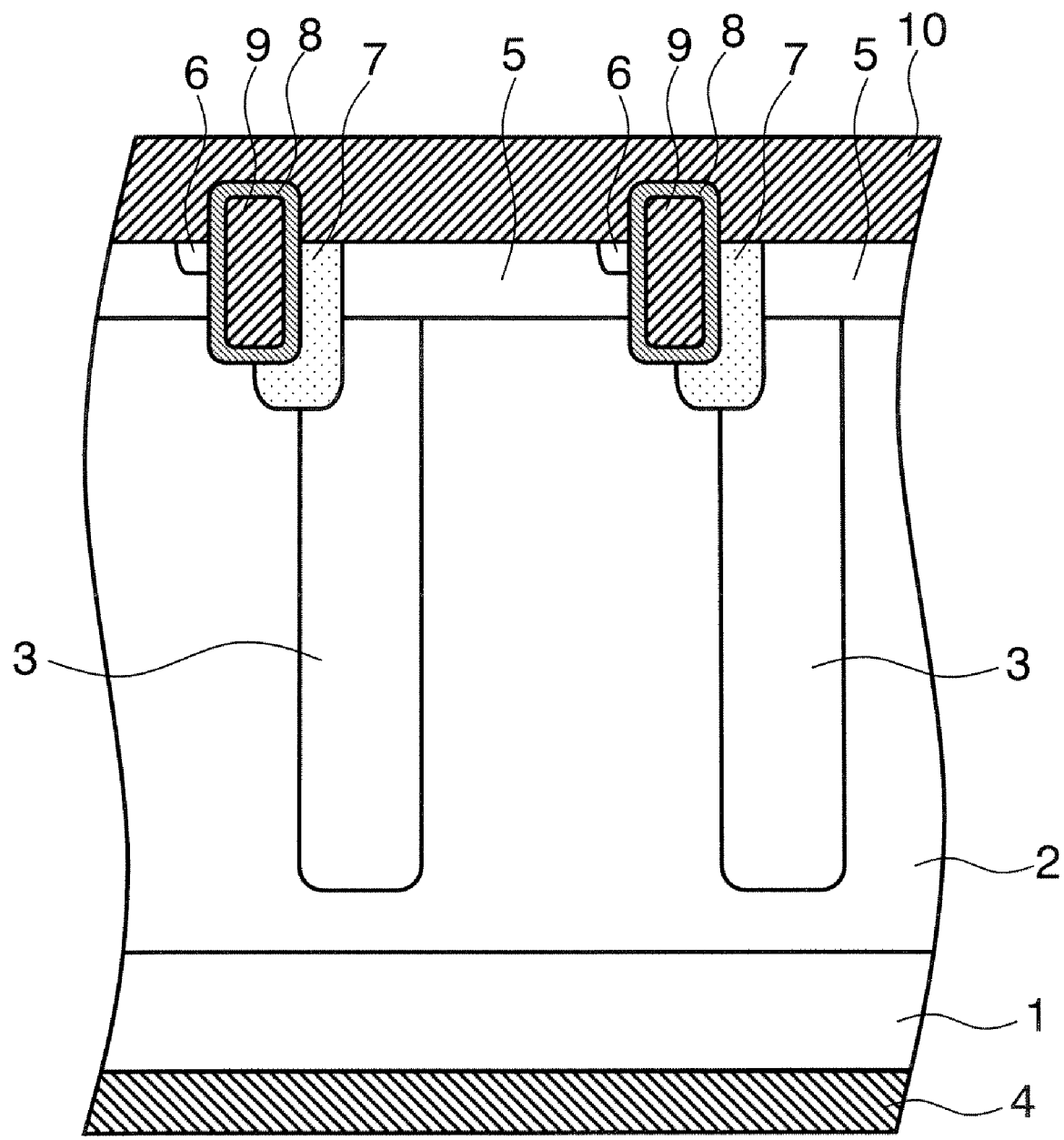
FIG. 9 is a schematic cross section showing the structure of a MOSFET according to a sixth embodiment of the invention.

FIG. 9 is a schematic cross section showing the structure of a MOSFET according to a sixth embodiment of the invention. Elements similar to those in the MOSFET shown in FIG. 1 are marked with the same reference numerals and not described in detail.

The MOSFET shown in this figure is different from the MOSFET shown in FIG. 1 in that the p-guard ring region 7 is formed only on one predetermined side of the trench gate. Such a structure is attributed to the adopted process where the p-guard ring region 7 is formed by oblique ion implantation.

FIG. 10 is a process cross section showing part of a process of manufacturing the MOSFET shown in FIG. 9. In FIG. 10 again, only the distinctive part of the process, that is, the step of forming the p-guard ring region 7 is shown, and the rest of the process is omitted.

Figure 10A:
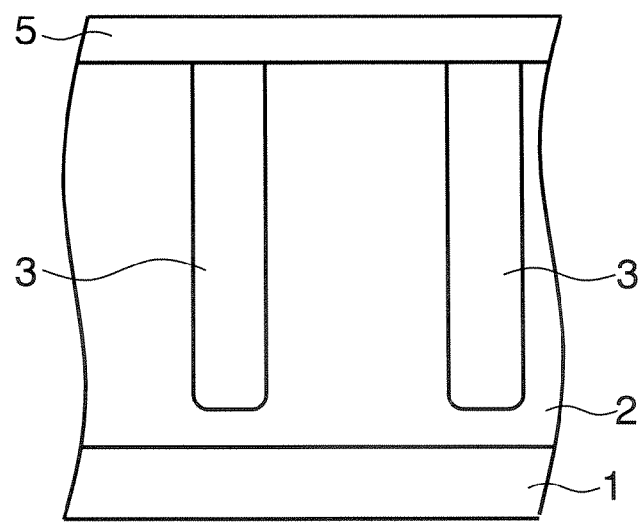
FIG. 10 is a process cross section showing part of a process of manufacturing the MOSFET shown in FIG. 9.

First, as shown in FIG. 10A, an n-type silicon layer serving as an n-pillar region 2 is epitaxially grown on a high-concentration n$^+$-silicon substrate serving as an n$^+$-drain layer 1. A p-type semiconductor region serving as a p-pillar region 3 is buried in a striped configuration. A p-type semiconductor layer serving as a p-base region 5 is epitaxially grown on the surface.

Figure 10B:
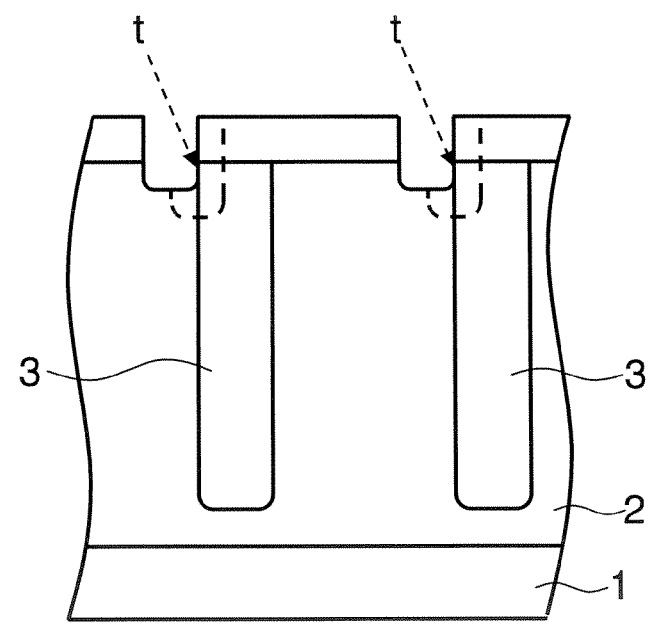

Next, as shown in FIG. 10B, a trench t is formed along one predetermined side face of the p-pillar region 3. Ion implantation of p-type impurities is conducted in an oblique direction on the sidewall at the p-pillar region 3 side of the trench t. As a result, p-type impurities are injected into the semiconductor layer adjacent to the side face at the p-pillar region side and the bottom face of the trench t.

Figure 10C:
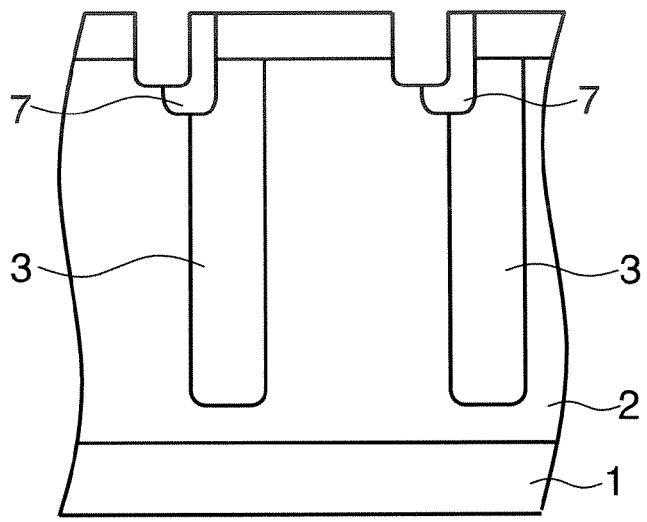

Next, as shown in FIG. 10C, heat treatment is applied to diffuse the injected p-type impurities, thereby forming a p-guard ring region 7. In a later step, a gate electrode 9 is formed in the trench t via a gate insulating film 8.

Thus oblique ion implantation is used to form a p-guard ring region 7 in self-alignment with the trench gate structure.

Again, in the structure of the MOSFET shown in FIG. 9, the point at which avalanche breakdown occurs is located at the bottom of the p-guard ring region 7, which is deeper than the gate electrode, because the bottom of the p-guard ring region 7 is formed deeper than the bottom of the trench groove. Thus, like the MOSFET shown in FIG. 1, the avalanche withstand capability and the reliability of the gate insulating film can be enhanced. Furthermore, the path of hole current flowing upon avalanche breakdown is only in the p-guard ring region 7, and hence the hole current does not flow into the p-base region 5 below the n-source region 6. Therefore the operation of the parasite bipolar transistor is prevented, and a high avalanche withstand capability can be expected.

On the basis of the MOSFET shown in FIG. 1, MOSFETs with modified structures have been described. In these MOSFETs, by varying the amount of impurities contained in the p-pillar region and the n-pillar region forming the superjunction, the region where avalanche breakdown occurs can be moved. The point at which avalanche breakdown occurs can be placed in a deep region in the semiconductor substrate to gain a large distance from the gate insulating film. In the following, the amount of impurities contained in the p-pillar region and the n-pillar region forming the superjunction is described in connection with the electric field strength using schematic cross sections and diagrams of MOSFETs.

Figures 11A, 11B:
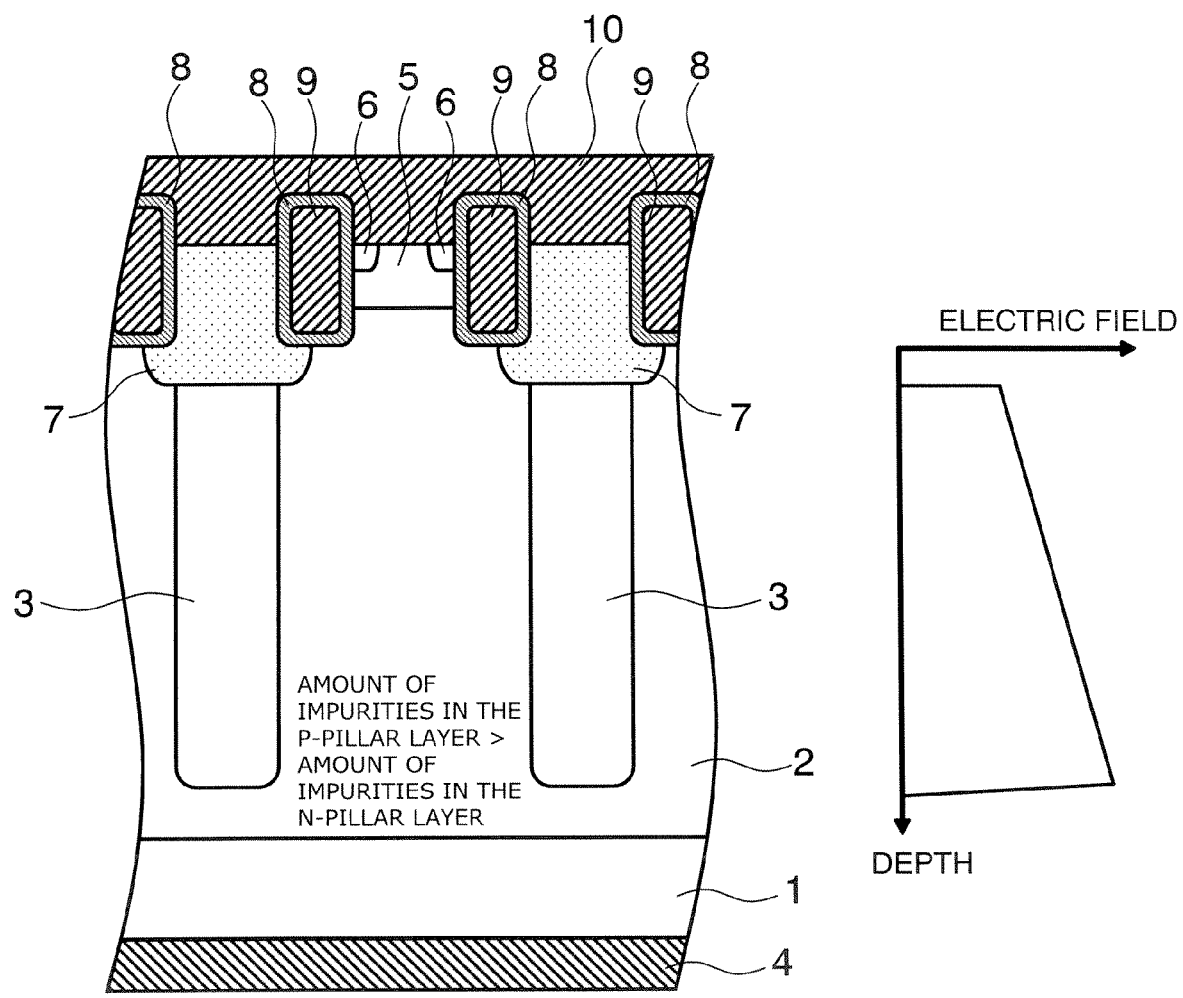
FIG. 11 shows a schematic cross section showing the structure of a MOSFET according to a seventh embodiment of the invention, and a graphical diagram showing the electric field distribution thereof.

FIG. 11A is a schematic cross section showing the structure of a MOSFET according to a seventh embodiment of the invention.

The MOSFET shown in this figure has the same structure as the MOSFET shown in FIG. 1. However, the amount of impurities in the p-pillar region 3 is about 5 to 10 percent larger than the amount of impurities contained in the n-pillar region. FIG. 11B is a graphical diagram showing the relationship between the depth in the substrate and the electric field strength under this condition.

The amount of impurities used herein refers to a value obtained by laterally integrating the impurity concentration in one pillar. That is, if the impurity concentration is constant in the pillar, the value equals the product of the impurity concentration and the pillar width. When the amount of impurities in the p-pillar region 3 is larger than the amount of impurities in the n-pillar region, the electric field distribution in the superjunction structure during application of high voltage exhibits increase toward the depth direction as shown in the diagram. Therefore the electric field is higher at the bottom of the superjunction structure than at the trench gate bottom, and avalanche breakdown is more likely to occur at the bottom of the superjunction structure. Thus, by allowing avalanche breakdown to occur at a more distant region from the gate electrode, the avalanche withstand capability and the reliability of the gate insulating film can be further enhanced.

Figures 12A, 12B, 12C:
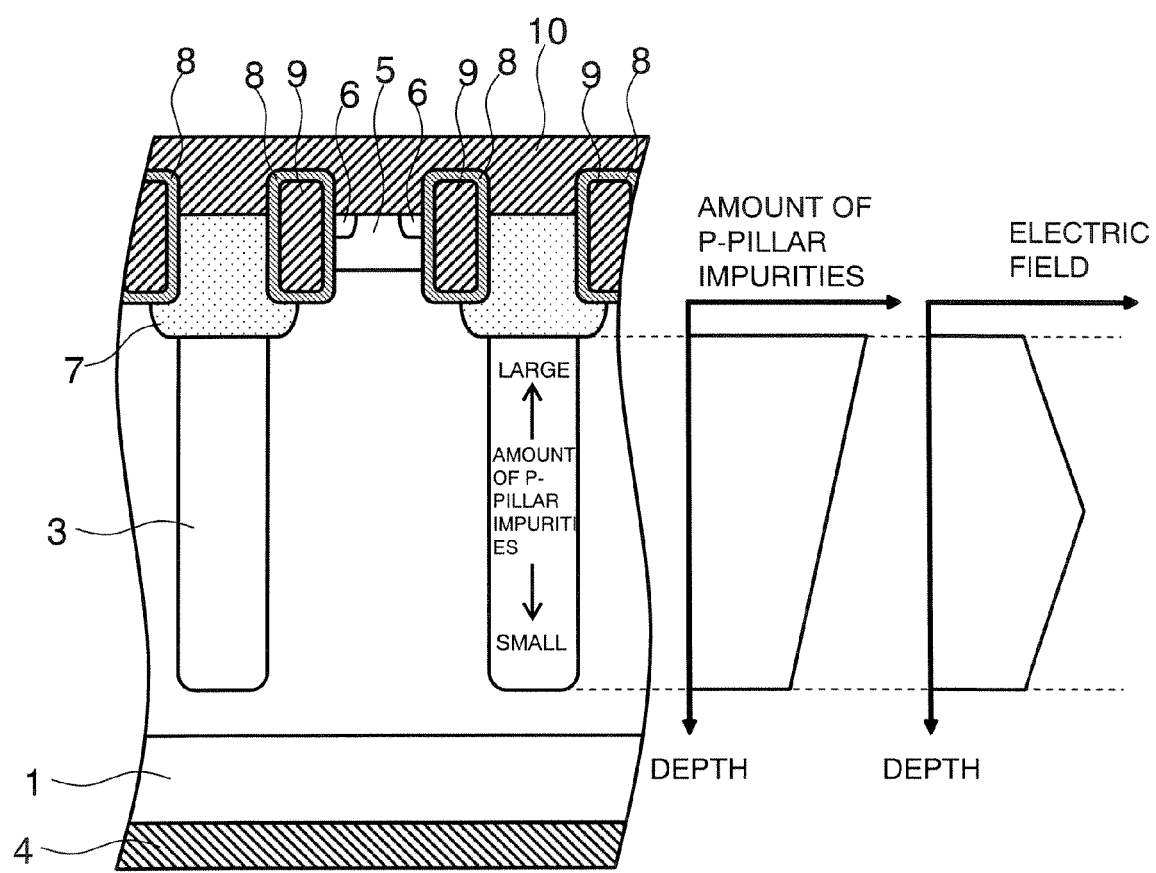
FIG. 12 shows a schematic cross section showing the structure of a MOSFET according to an eighth embodiment of the invention, and graphical diagrams showing the impurity concentration distribution and the electric field distribution thereof, respectively.

FIG. 12A is a schematic cross section showing the structure of a MOSFET according to an eighth embodiment of the invention.

The MOSFET shown in this figure has the same structure as the MOSFET shown in FIG. 1. However, the amount of impurities in the p-pillar region 3 decreases along the depth direction. FIGS. 12B and 12C are graphical diagrams showing, under this condition, the relationship between the depth in the substrate and the amount of p-pillar impurities, and the relationship between the depth in the substrate and the electric field strength, respectively.

When the amount of impurities in the p-pillar region 3 decreases along the depth direction, the electric field in the superjunction structure is maximized at the center. Therefore the electric field is higher at the center of the superjunction structure than at the trench gate bottom, and avalanche breakdown is more likely to occur at the center of the superjunction structure. Thus, by allowing avalanche breakdown to occur at a more distant region from the gate electrode, the avalanche withstand capability and the reliability of the gate insulating film can be further enhanced.

Figures 13A, 13B, 13C:
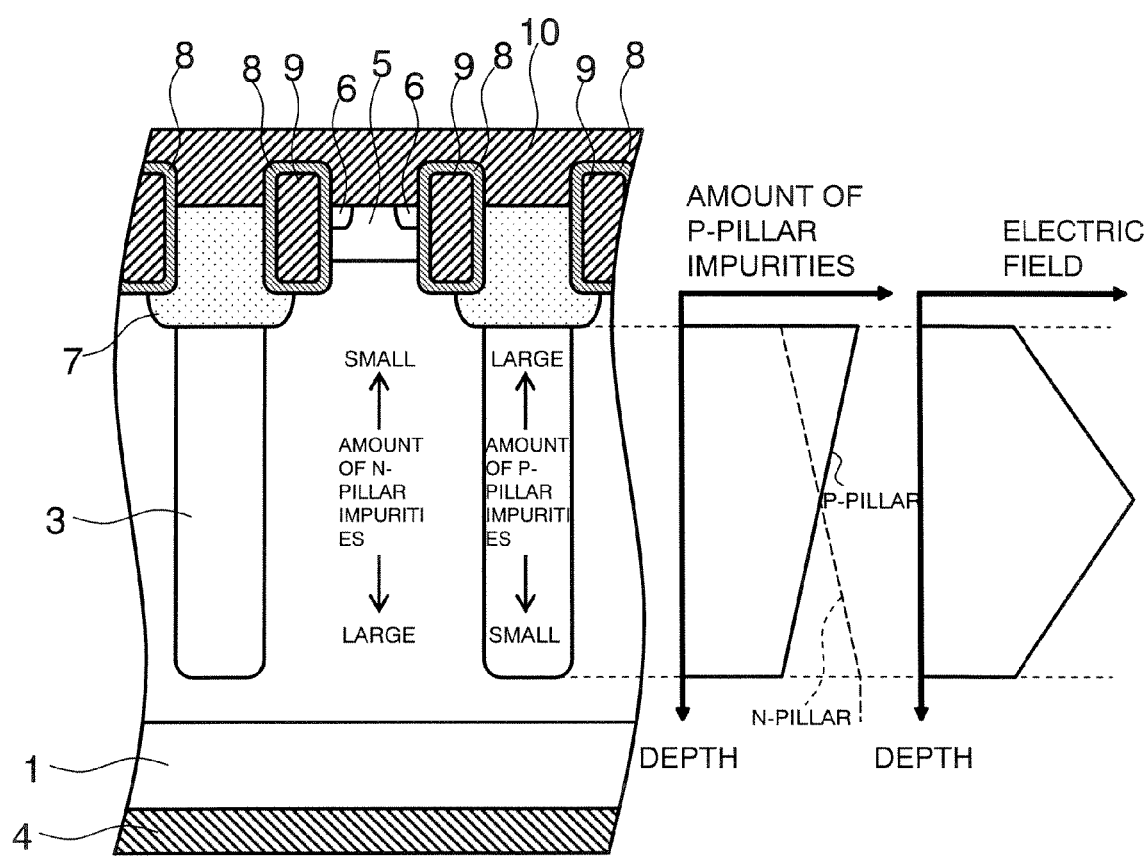
FIG. 13 shows a schematic cross section showing the structure of a MOSFET according to a ninth embodiment of the invention, and graphical diagrams showing the impurity concentration distribution and the electric field distribution thereof, respectively.

FIG. 13A is a schematic cross section showing the structure of a MOSFET according to a ninth embodiment of the invention.

The MOSFET shown in this figure has the same structure as the MOSFET shown in FIG. 1. However, along the depth direction, the amount of impurities in the p-pillar region 3 decreases, and the amount of impurities in the n-pillar region 2 increases. FIGS. 13B and 13C are graphical diagrams showing, under this condition, the relationship between the depth in the substrate and the amount of impurities in each pillar, and the relationship between the depth in the substrate and the electric field strength, respectively.

When the amount of impurities in the p-pillar region 3 decreases along the depth direction and the amount of impurities in the n-pillar region 2 increases along the depth direction, the electric field in the superjunction structure is maximized at the center, and the electric field concentration is further enhanced as compared to the case of FIG. 12. Therefore avalanche breakdown is more likely to occur at the center of the superjunction structure. This results in increasing the probability that avalanche breakdown occurs at a more distant region from the gate electrode. Thus the avalanche withstand capability and the reliability of the gate insulating film can be further enhanced.

Figure 14:
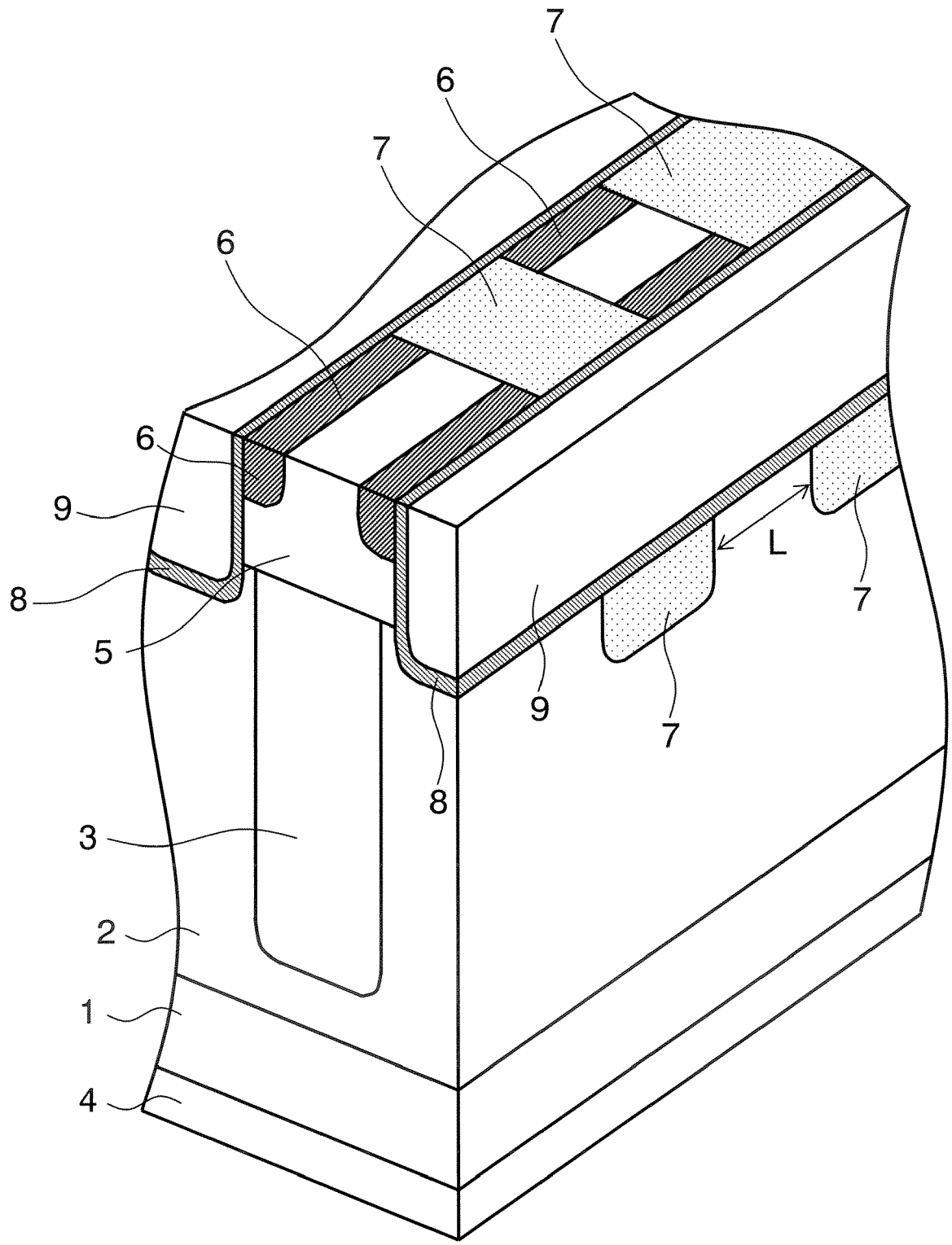
FIG. 14 is a perspective schematic view showing the structure of a MOSFET according to a tenth embodiment of the invention.

FIG. 14 is a perspective schematic view showing the structure of a MOSFET according to a tenth embodiment of the invention. Elements similar to those in the MOSFET shown in FIG. 3 are marked with the same reference numerals and not described in detail.

The MOSFET shown in this figure is different from the MOSFET shown in FIG. 3 in that the p-guard ring regions 7 are formed in a striped configuration in a direction orthogonal to the gate electrode 9. At the orthogonal intersection with the gate electrode, the p-guard ring region 7 is formed at the trench bottom. By using the configuration in this figure, the spacing between the gate electrodes 9 can be narrowed to increase the device density.

Furthermore, the spacing L between the guard ring regions 7 can be narrowed to decrease the electric field at the trench gate bottom. When the guard ring region 7 is arranged parallel to the gate electrode 9 as in the MOSFET shown in FIG. 3, the spacing L between the guard ring layers is determined by the spacing of the superjunction structure. In contrast, in the structure of the MOSFET shown in the present figure, the spacing L between the guard ring layers can be freely selected, and the effect of reducing the electric field at the trench gate bottom can be further enhanced.

The structure of the cell portion in MOSFETs has been described. In order for these devices to actually work as power devices, the structure of the end portion is also an important factor. In the following, the device structure of the foregoing MOSFETs is described with reference to the drawings.

Figure 15:
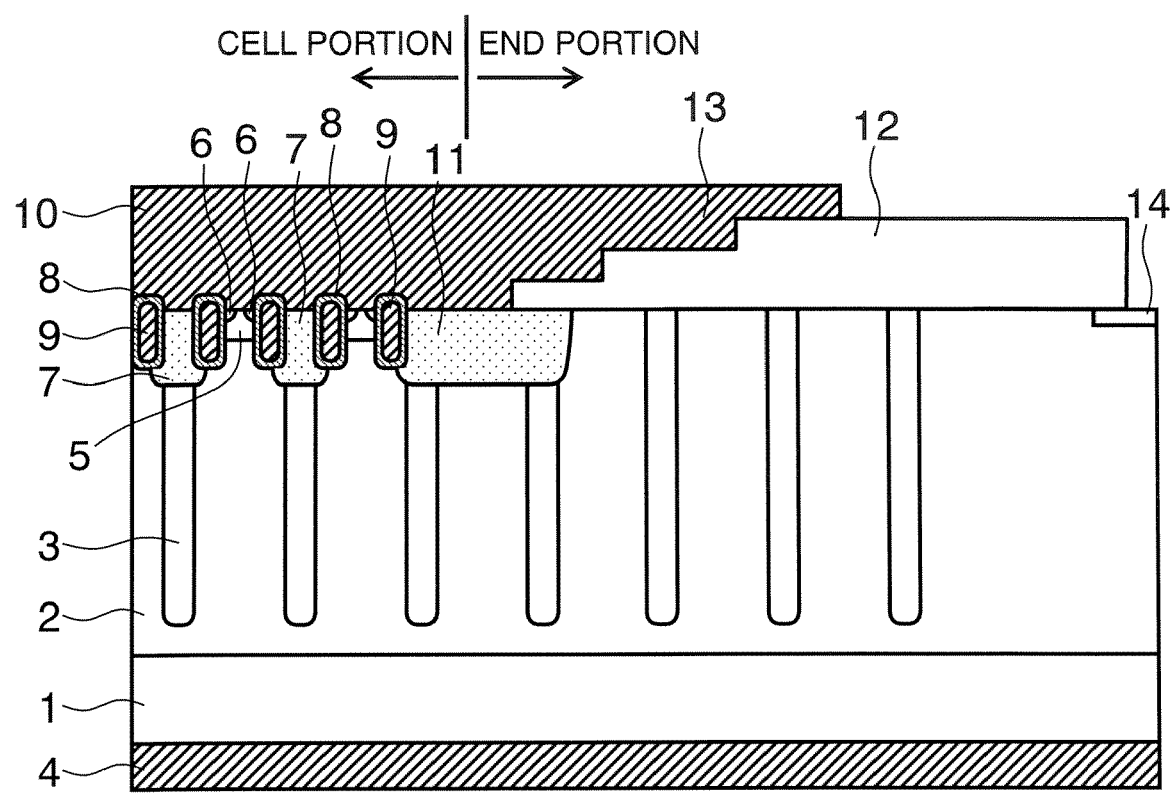
FIG. 15 is a schematic cross section showing the structure of a MOSFET according to an eleventh embodiment of the invention.

FIG. 15 is a schematic cross section showing the structure of a MOSFET according to an eleventh embodiment of the invention. Specifically, the structure of the end portion is shown in addition to the cell portion of the MOSFET shown in FIG. 1. Elements similar to those in the MOSFET shown in FIG. 1 are marked with the same reference numerals and not described in detail.

In this embodiment, a second p-guard ring region 11 is also formed on the periphery of the cell portion where the MOS gate is formed. The second p-guard ring region serves to prevent the decrease of breakdown voltage due to electric field concentration at the end portion. Furthermore, the source electrode 10 can be extended onto the insulating film 12 formed on the semiconductor layer of the end portion to serve as a field plate electrode 13, which laterally extends the depletion layer to alleviate electric field concentration applied to the end portion of the second p-guard ring region 11. A field stop layer 14 is provided to prevent the depletion layer from reaching the dicing line during application of high voltage. Thus the reliability during application of high voltage is ensured.

Figure 16:
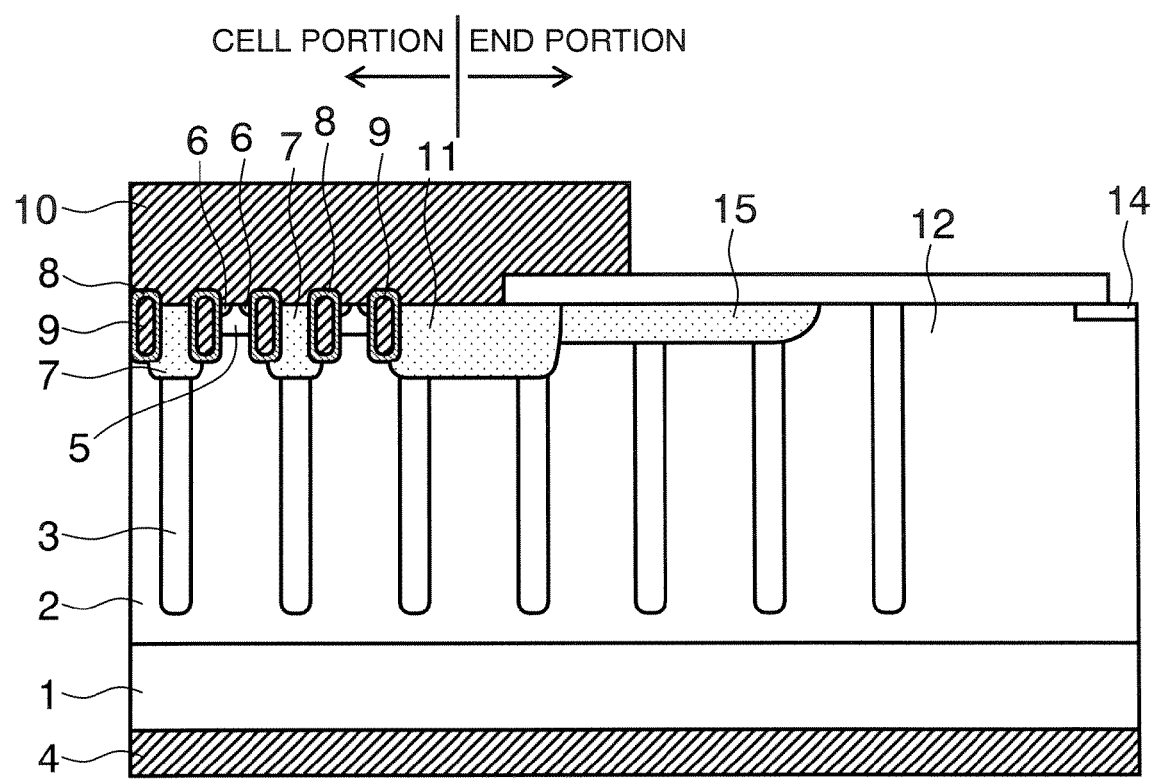
FIG. 16 is a schematic cross section showing the structure of a MOSFET according to a twelfth embodiment of the invention.

FIG. 16 is a schematic cross section showing the structure of a MOSFET according to a twelfth embodiment of the invention. Specifically, the structure of the end portion is shown in addition to the cell portion of the MOSFET shown in FIG. 1. Elements similar to those in the MOSFET shown in FIG. 15 are marked with the same reference numerals and not described in detail.

The MOSFET of this embodiment is different from the MOSFET shown in FIG. 15 in that, instead of the field plate electrode 13, a RESURF layer 15 made of a $p^-$-type semiconductor layer is provided in the end portion. The RESURF (Reduced Surface Field) structure facilitates the lateral expansion of the depletion layer when the MOSFET is turned off, thus alleviating electric field concentration applied to the end portion of the second p-guard ring region 11 and increasing the breakdown voltage of the device.

Figure 17:
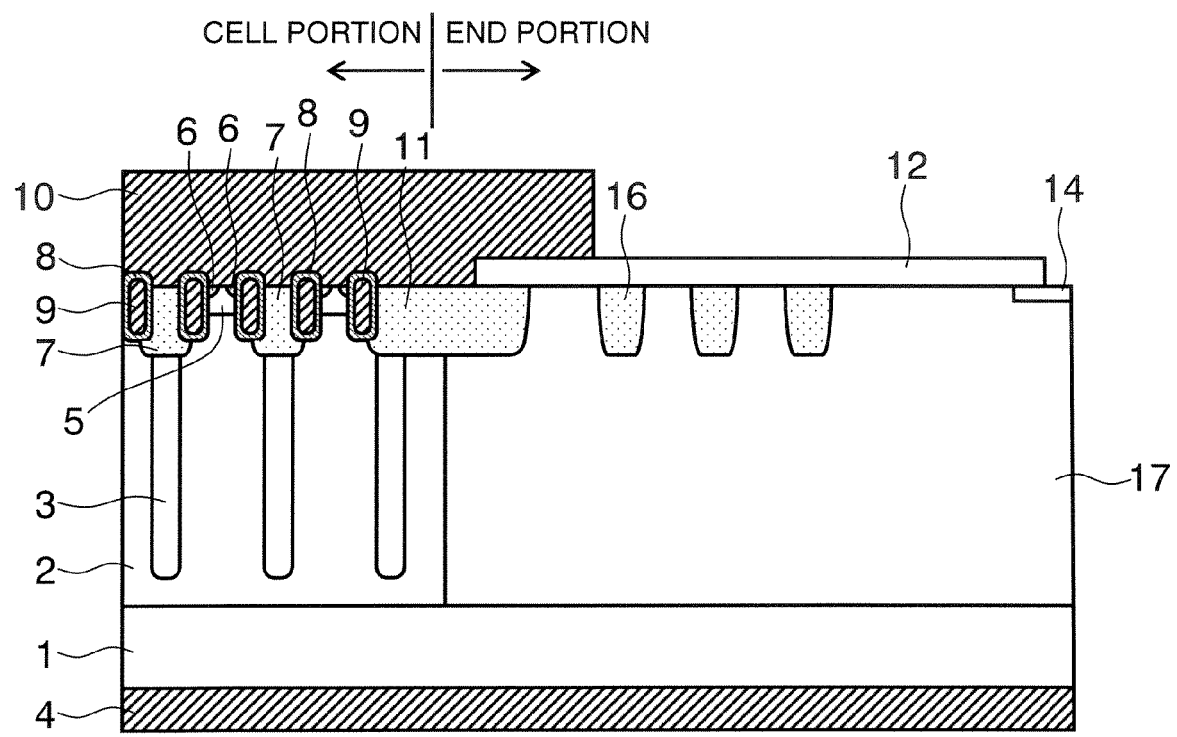
FIG. 17 is a schematic cross section showing the structure of a MOSFET according to a thirteenth embodiment of the invention.

FIG. 17 is a schematic cross section showing the structure of a MOSFET according to a thirteenth embodiment of the invention. Elements similar to those in the MOSFET shown in FIG. 15 are marked with the same reference numerals and not described in detail.

The MOSFET of this embodiment is different from the MOSFET shown in FIG. 15 in that the superjunction structure is not formed in the end portion but a high resistance layer 17 is formed instead. The high resistance layer 17 is preferably made of an n-type semiconductor whose impurity concentration is lower than the impurity concentration of the n-pillar region 2. A third guard ring region 16 is formed on the substrate surface to achieve high breakdown voltage. The third guard ring region 16 can be formed by the same process as the first guard ring region 7 and the second guard ring region 11.

Figure 18:
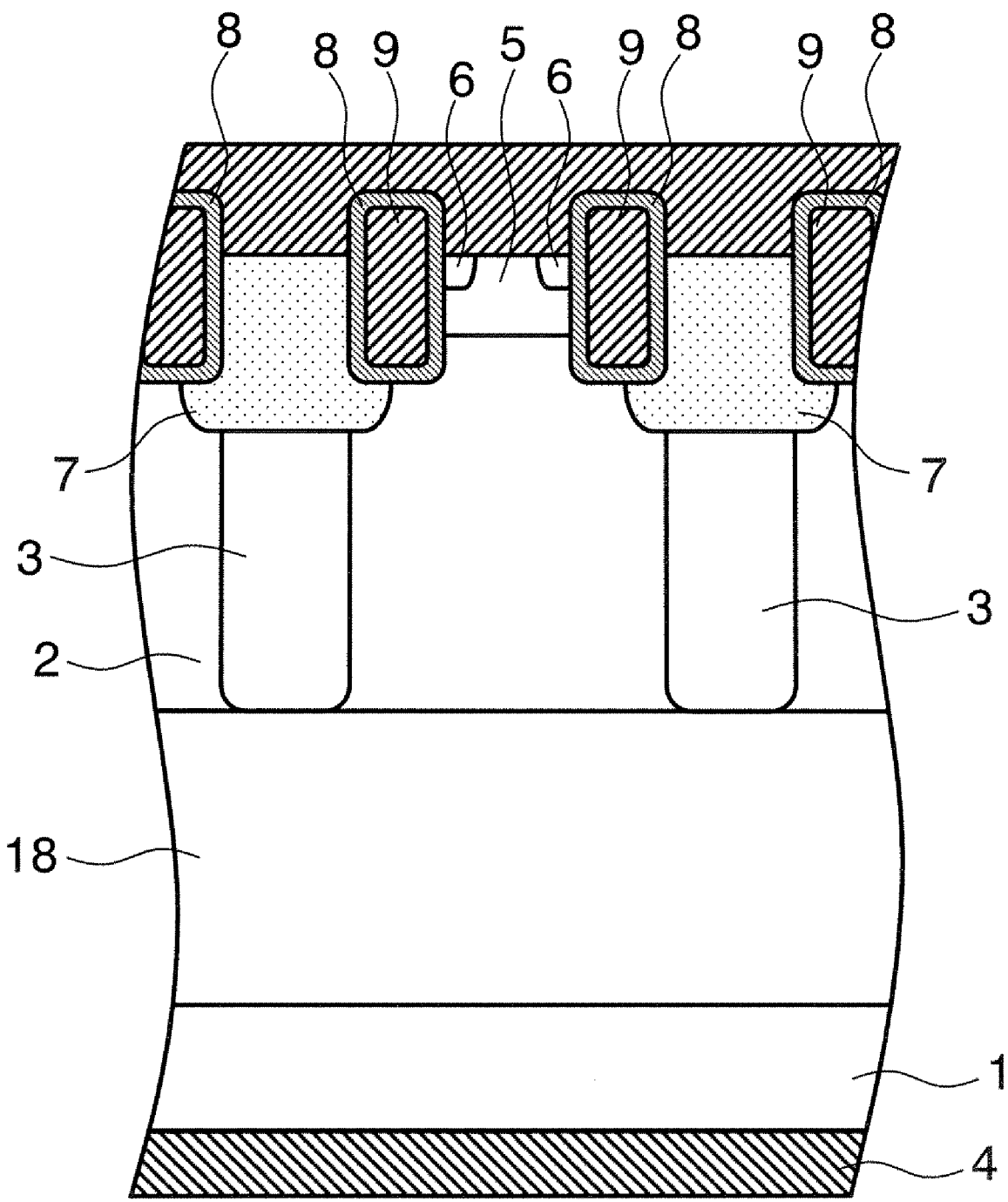
FIG. 18 is a schematic cross section showing the structure of a MOSFET according to a fourteenth embodiment of the invention.

FIG. 18 is a schematic cross section showing the structure of a MOSFET according to a fourteenth embodiment of the invention. Elements similar to those in the MOSFET shown in FIG. 1 are marked with the same reference numerals and not described in detail.

The MOSFET of this embodiment is different from the MOSFET shown in FIG. 1 in that an $n^-$-layer 18 is formed between the $n^+$-drain layer 1 and the superjunction structure. In the structure of this figure again, the point at which avalanche breakdown occurs is located at the bottom of the p-guard ring region 7, which is deeper than the gate electrode, because the bottom of the p-guard ring region 7 is formed deeper than the bottom of the trench groove. Thus, like the MOSFET shown in FIG. 1, the avalanche withstand capability and the reliability of the gate insulating film can be enhanced. Furthermore, because the $n^-$-layer 18 is newly provided, the voltage in the off-state can be supported by the superjunction structure and the $n^-$-layer 18, thus achieving high breakdown voltage.

The first to fourteenth embodiment of the invention have been described with reference to the drawings. However, the invention is not limited to these embodiments. For example, while the foregoing description assumes the first conductivity type as n-type and the second conductivity type as p-type, the invention can also be practiced assuming the first conductivity type as p-type and the second conductivity type as n-type. Any technically feasible combinations of the embodiments are also encompassed within the scope of the invention. For example, the MOSFET cell portion according to the first to tenth embodiment can be freely combined as appropriate with the MOSFET end portion according to the eleventh to fourteenth embodiment, and such combinations are encompassed within the scope of the invention.

Any technically feasible combinations of the features of the second embodiment and the third to fourteenth embodiment are also encompassed within the scope of the invention.

Furthermore, any modifications adapted by those skilled in the art are also encompassed within the scope of the invention as long as they include the spirit of the invention. For example, the planar pattern of the MOS gates or the superjunction structure is not limited to the striped configuration, but may be formed in a lattice or staggered configuration.

The semiconductor used in the example MOSFETs described above is silicon (Si). However, compound semiconductors such as silicon carbide (SiC) and gallium nitride (GaN) or wide bandgap semiconductors such as diamond can also be used.

MOSFETs having the superjunction structure have been illustrated. However, application to hybrid devices of MOSFETs and Schottky barrier diodes (SBD) or to IGBTs (Insulated Gate Bipolar Transistors) is also encompassed within the scope of the invention as long as the devices have both the trench gate structure and the superjunction structure.

Figure 19:
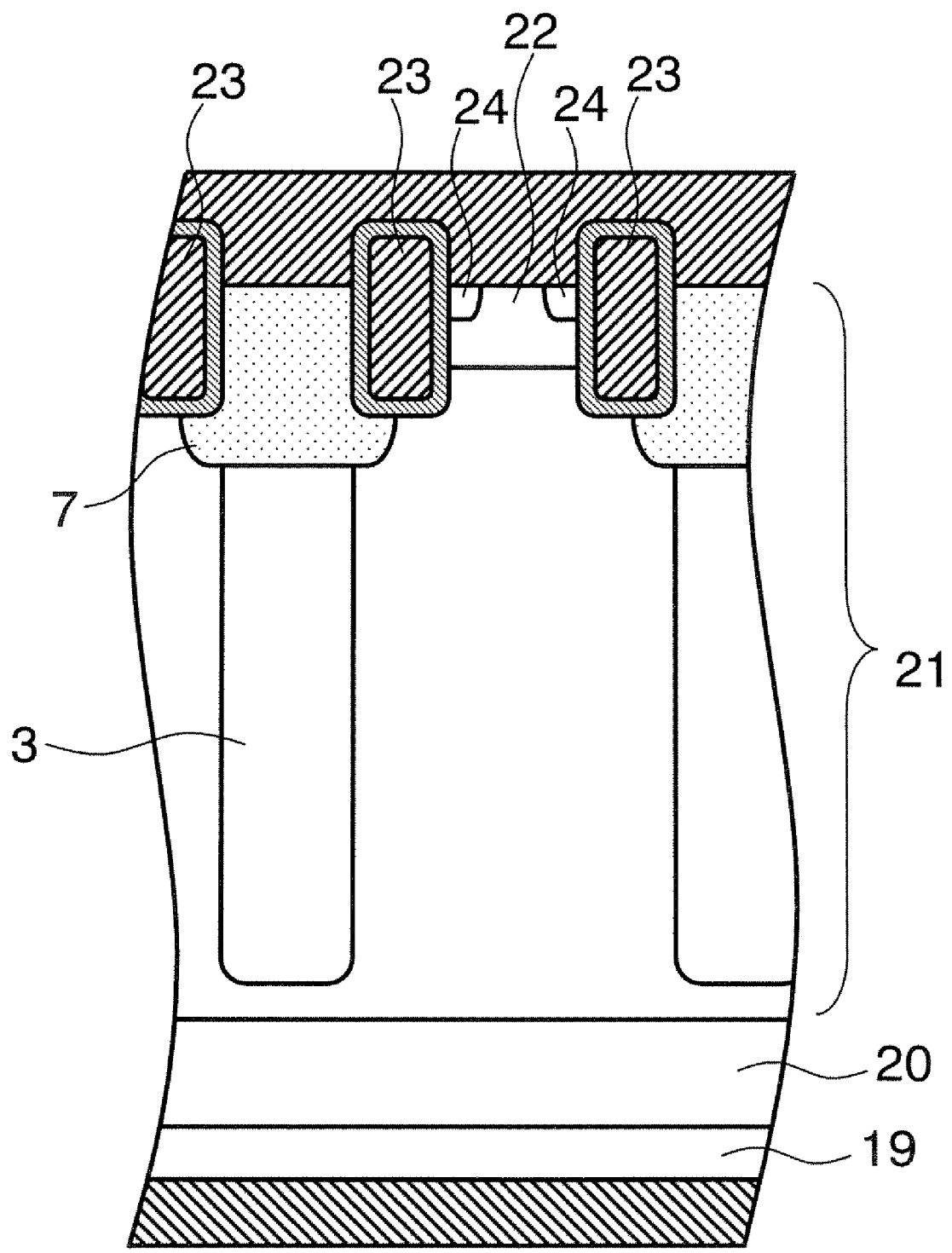
FIG. 19 is a schematic cross section showing the structure of an IGBT according to an embodiment of the invention.

FIG. 19 is a schematic cross section showing the structure of an IGBT according to an embodiment of the invention.

As shown in FIG. 19, a vertical IGBT is formed from a collector layer 19, a buffer layer 20, a base region 22 formed in the surface of a drift layer 21, a trench gate electrode 23 formed in the base region, and an emitter 24. Although the nomenclature of individual elements and part of the structure are different from the MOSFET shown in FIG. 1, the configuration in the vicinity of the gate electrode is the same. Therefore the same effect as in the first to tenth embodiment of the invention can also be achieved in IGBTs.

In FIGS. 8 and 10, the superjunction structure is formed by a process of forming a trench groove and filling the groove by crystal growth. However, the invention is not limited to the process of forming the superjunction structure, but can also be practiced using other processes. For example, the invention can be based on a process of repeating a plurality of iterations of ion implantation and burying crystal growth, or a process of forming a trench groove and forming a pillar layer by ion implantation or vapor phase diffusion into the sidewall of the groove.

The invention claimed is:

1. A semiconductor device comprising:
a first semiconductor layer of a first conductivity type;
a first semiconductor region of the first conductivity type and a second semiconductor region of a second conductivity type alternately arranged in a lateral direction on the first semiconductor layer of the first conductivity type;
a third semiconductor region of the second conductivity type formed on the first semiconductor region;
a fourth semiconductor region of the first conductivity type formed on a portion of the surface of the third semiconductor region;
a control electrode provided via an first insulating film in a groove formed in contact with the fourth semiconductor region, the third semiconductor region, and the first semiconductor region;
a first main electrode electrically connected to the first semiconductor layer;
a second main electrode forming a junction with the third and fourth semiconductor region; and
a fifth semiconductor region of the second conductivity type formed in contact with the first insulating film, the first semiconductor region, and the second semiconductor region, the bottom face of the fifth semiconductor region being deeper than the bottom face of the control electrode,
the fifth semiconductor region having a higher impurity concentration than the third semiconductor region.

2. A semiconductor device according to claim 1, wherein the fifth semiconductor region is formed on the second semiconductor region.

3. A semiconductor device according to claim 1, wherein the fifth semiconductor region is connected to the second main electrode.

4. A semiconductor device according to claim 1, wherein an amount of impurities in the second semiconductor region decreases toward the first semiconductor layer.

5. A semiconductor device according to claim 4, wherein an amount of impurities in the first semiconductor region increases toward the first semiconductor layer.

6. A semiconductor device according to claim 1, wherein the control electrode is formed in a striped configuration, the fifth semiconductor region is formed in a striped configuration, and the control electrode and the fifth semiconductor region orthogonally intersect each other.

7. A semiconductor device according to claim 1, further comprising a sixth semiconductor region of the second conductivity type provided on a periphery of a cell portion, the sixth semiconductor region being formed in contact with the first insulating film, the first semiconductor region, and the second semiconductor region, the bottom face of the fifth semiconductor region being deeper than the bottom face of the control electrode.

8. A semiconductor device according to claim 7, further comprising:
a second insulating film provided on a end portion which surrounds the cell portion; and
a field plate electrode provided on the second insulating film and connected to one of the control electrode and the first main electrode.

9. A semiconductor device according to claim 7, further comprising a seventh semiconductor region of the second conductivity type provided on a end portion which surrounds the cell portion.

10. A semiconductor device according to claim 7, further comprising a guard ring of the second conductivity type provided on a end portion which surrounds the cell portion.

11. A semiconductor device according to claim 1, further comprising a second semiconductor layer of the first conductivity type provided between the first semiconductor layer and the second semiconductor region, an impurity concentration of the second semiconductor layer being lower than an impurity concentration of the first semiconductor region.

* * * * *